United States Patent
Templier et al.

(10) Patent No.: US 12,426,398 B2
(45) Date of Patent: Sep. 23, 2025

(54) OPTOELECTRONIC DEVICE WITH SUPERIMPOSED EMISSIVE AND PHOTODETECTOR COMPONENTS

(71) Applicant: COMMISSARIAT A L'ENERGIE ATOMIQUE ET AUX ENERGIES ALTERNATIVES, Paris (FR)

(72) Inventors: François Templier, Grenoble (FR); Jean-François Mainguet, Grenoble (FR); Margaux Vigier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 615 days.

(21) Appl. No.: 17/929,908

(22) Filed: Sep. 6, 2022

(65) Prior Publication Data

US 2023/0081818 A1     Mar. 16, 2023

(30) Foreign Application Priority Data

Sep. 13, 2021 (FR) .................... 21 09581

(51) Int. Cl.
*H10K 59/60* (2023.01)
*G09G 5/10* (2006.01)
(Continued)

(52) U.S. Cl.
CPC ............ *H10F 55/18* (2025.01); *G09G 5/10* (2013.01); *H10F 71/121* (2025.01); *G09G 2360/148* (2013.01)

(58) Field of Classification Search
None
See application file for complete search history.

(56) References Cited

U.S. PATENT DOCUMENTS

| 2006/0007220 A1 | 1/2006 | Perner |
| 2018/0269240 A1 | 9/2018 | Mainguet et al. |

(Continued)

FOREIGN PATENT DOCUMENTS

EP    3 381 060 A1    10/2018

OTHER PUBLICATIONS

French Preliminary Search Report Issued May 4, 2022 in French Application 21 09581 filed on Sep. 13, 2021 (with English Translation of Categories of Cited Documents), citing documents 1-4 therein, 2 pages.

(Continued)

*Primary Examiner* — Benjamin P Sandvik
(74) *Attorney, Agent, or Firm* — Oblon, McClelland, Maier &Neustadt, L.L.P.

(57) ABSTRACT

An optoelectronic device including at least an emissive component including at least a first electrode, a second electrode, and an emissive element disposed between an emissive face of the optoelectronic device and the second electrode, a photodetector component such that the second electrode of the emissive component is disposed between the photodetector component and the emissive element. The emissive component and the photodetector component are superimposed one above the other, and the second electrode has at least one hole passing through it, disposed vertically in line with at least a part of a detection surface of the photodetector component and/or a part of the detection surface of the photodetector component is not disposed vertically in line with the second electrode and form a ring located at the external edges of the detection surface of the photodetector component.

12 Claims, 6 Drawing Sheets

(51) Int. Cl.
 *H10F 55/00* (2025.01)
 *H10F 71/00* (2025.01)

(56) References Cited

U.S. PATENT DOCUMENTS

2019/0346939 A1 11/2019 Na et al.
2020/0161520 A1 5/2020 Hugon et al.
2022/0320197 A1* 10/2022 Wang .................. H10K 59/121

OTHER PUBLICATIONS

Templier et al., "A New Approach for Fabricating High-Performance MicroLED Displays", SID Symposium Digest of Technical Papers, vol. 50 (1), Jun. 1, 2019, 4 Pages.

* cited by examiner

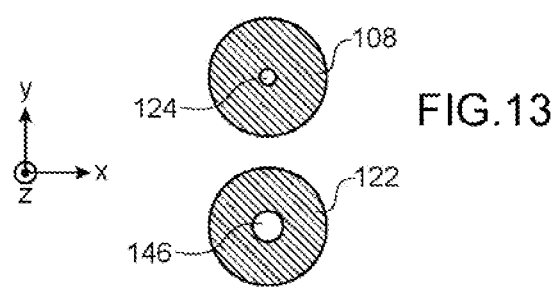
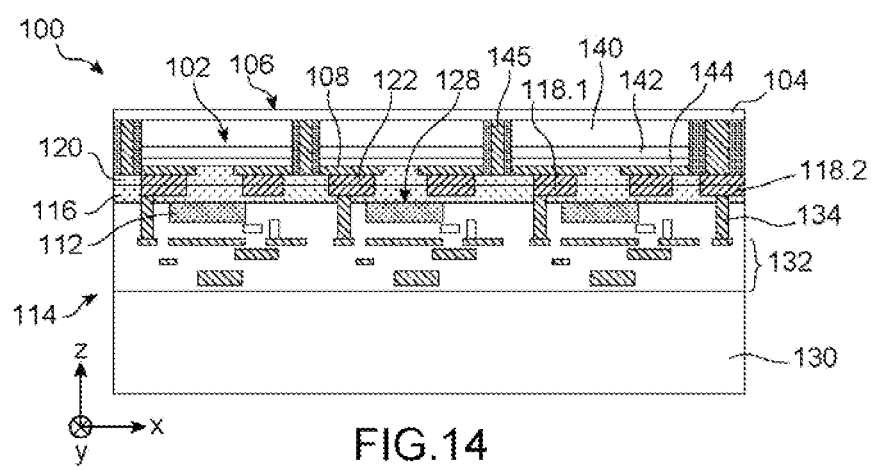
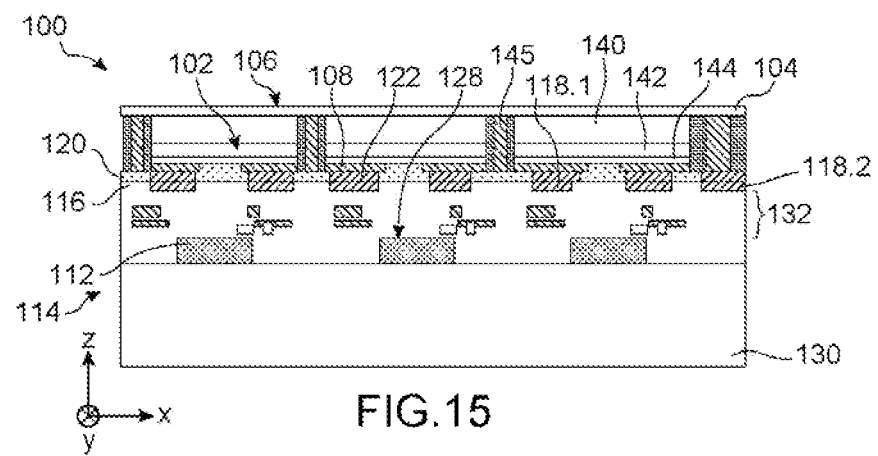

Display command

OPTOELECTRONIC DEVICE WITH SUPERIMPOSED EMISSIVE AND PHOTODETECTOR COMPONENTS

TECHNICAL FIELD

This document relates to the field of optoelectronic devices combining display and optical-capture functions.

PRIOR ART

Several types of optoelectronic device combining display and optical capture functions exist, comprising for example LEDs or OLEDs for fulfilling the display function and organic or inorganic photodiodes for capturing the light of the visible and/or infrared domain. In all the types of device, these two functions are separated laterally from each other, i.e., seen from one face of the device from which the emission and the capture are implemented, the components implementing the display do not overlap the components implementing the capture so that all the components can send or receive light from this face. However, this limits the resolution that can be achieved by these devices.

In addition, when such devices incorporate a calibration function, i.e. when the photodetector components are used for calibrating the emissive components, successive reflections of the light emitted by the emissive components implementing the display are necessary for the light to reach the photodetector components implementing the calibration, which poses problems of efficacy and performance.

DESCRIPTION OF THE INVENTION

Thus there is a need to propose an optoelectronic device not having the drawbacks indicated above.

For this purpose, one embodiment proposes an optoelectronic device comprising at least:
an emissive component including at least a first electrode, a second electrode, and an emissive element disposed between an emissive face of the optoelectronic device and the second electrode;
a photodetector component such that the second electrode of the emissive component is disposed between the photodetector component and the emissive element;
wherein:
the emissive component and the photodetector component are superimposed one above the other, and
the second electrode has at least one hole passing through it, disposed vertically in line, or directly above, with at least a part of a detection surface of the photodetector component and/or a part of the detection surface of the photodetector component is not disposed vertically in line with the second electrode and form a ring located at the external edges of the detection surface of the photodetector component.

In this optoelectronic device, the emissive component and the photodetector component are superimposed one on the other. The superimposition, or layering, of the emissive component and the photodetector component means that at least a part of the emissive element of the emissive component is arranged vertically in line with, or facing, the photodetector component. By means of this superimposition of the emissive and photodetector components, the part of the emissive surface dedicated solely to the light-detection function is very small. No space is specifically dedicated to the photodetector components, which makes it possible to produce a plurality of emissive components alongside each other with a high resolution. In addition, the loss of brightness of the emissive component caused by the presence of the photodetector component is minimal. Finally, when the photodetector component is intended to detect at least part of the light emitted by the emissive component, such as for example when the photodetector component is intended to serve for calibrating the emissive component, the light captured by the photodetector component does not undergo reflections through the optoelectronic device, thus guaranteeing good efficacy and performances of the optoelectronic device.

This optoelectronic device therefore proposes to implement one or more bidirectional pixels, the light-emission and optical-capture functions of which are integrated vertically one above the other.

In a particular configuration, only a part of the detection surface of the photodetector component is not disposed vertically in line with the second electrode. In other words, another part of the detection surface of the photodetector component is disposed vertically in line with the second electrode.

The emissive face of the electronic device corresponds to the face of the optoelectronic device through which the emissive component or components emit light.

The photodetector component may form part of an integrated circuit or of an electronic module comprising other electronic components configured to control at least the photodetector component and the emissive component and/or to store at least one measurement value intended to be delivered as an output of the photodetector component.

The photodetector component may be configured to measure a luminosity value of the emissive component and/or a luminosity value of a light received through the emissive face of the optoelectronic device.

The optoelectronic device may furthermore include at least one device for calculating compensation of a control signal of the emissive component according to at least the measured luminosity value of the emissive component.

In a first embodiment, the hole may include, in a plane parallel to the detection surface of the photodetector component, a circular cross section.

In a second embodiment, the part of the detection surface of the photodetector component that is not disposed vertically in line with the second electrode forms a ring located at the external edges of the detection surface of the photodetector component.

In another configuration, the optoelectronic device may be such that:
the emissive component forms part of a set of emissive components disposed alongside each other and each including at least a first electrode, a second electrode, and an emissive element disposed between the emissive face of the optoelectronic device and the second electrode, and
a part of the detection surface of the photodetector component is not disposed vertically in line with the second electrode of each of the emissive components.

Advantageously, the emissive component may form part of a matrix of emissive components, and may furthermore comprise a plurality of other photodetector components such that the second electrode of at least some of the emissive components has at least one hole passing through it disposed vertically in line with at least a part of a detection surface of one of the photodetector components and/or such that a part of the detection surface of one of the photodetector components is not disposed vertically in line with the second electrode of at least one of the emissive components.

The optoelectronic device may furthermore include at least:

a first dielectric layer covering at least the photodetector components and first connection pads disposed in the first dielectric layer;

a second dielectric layer covering at least the emissive components and second connection pads disposed in the second dielectric layer;

and wherein the first dielectric layer is secured to the second dielectric layer, and the first connection pads are secured to the second connection pads.

In this configuration, when the photodetector component forms part of an integrated circuit, the first connection pads may be electrically coupled to portions of an interconnection level of the integrated circuit by vias.

In a variant, the emissive components and the photodetector components may form modules distinct from each other, attached to a support and each comprising at least one of the emissive components and one of the photodetector components.

Another embodiment relates to a method for producing an optoelectronic device, comprising at least:

producing at least one emissive component including at least a first electrode, a second electrode, and an emissive element disposed between an emissive face of the optoelectronic device and the second electrode;

producing at least one photodetector component such that the second electrode of the emissive component is disposed between the photodetector component and the emissive element, and such that the emissive component and the photodetector component are superimposed one above the other;

and wherein the second electrode has at least one hole passing through it disposed vertically in line with at least a part of a detection surface of the photodetector component and/or wherein a part of the detection surface of the photodetector component is not disposed vertically in line with the second electrode and form a ring located at the external edges of the detection surface of the photodetector component.

The photodetector component may be implemented in an integrated circuit or an electronic module comprising other electronic components configured for controlling at least the photodetector component and the emissive component and/or storing at least one measurement value intended to be delivered as an output of the photodetector component.

The method may furthermore include:

after the production of the photodetector component, producing at least a first dielectric layer covering at least the photodetector component and producing first connection pads in the first dielectric layer;

after the production of the emissive component, producing at least one second dielectric layer covering at least the emissive component and producing second connection pads in the second dielectric layer;

securing, by direct bonding, the first dielectric layer against the second dielectric layer, and first connection pads against the second connection pads.

Direct bonding means here a bonding of the molecular type, without the addition of adhesive material or brazing at the interface between the elements secured by such bonding. In the case of a direct bonding, once the two elements are aligned, a simple putting of these elements in contact suffices to fix the final position of one with respect to the other. In other words, the bonding is instantaneous. This constitutes a difference compared with a bonding with the addition of material, for example by brazing, wherein a compression and/or heating step must be used after the two circuits are aligned and put in contact, which may lead to a misalignment of the circuits. The direct bonding may be hydrophobic or hydrophilic.

The optoelectronic device may be used for various applications:

calibration of a screen, autocalibrated screen;

system for measuring and controlling illumination;

smart illumination;

interactive screen with face and/or movement and/or identification and/or recognition capture.

In the entire document, the term "on" is used without distinction of the orientation in space of the element to which this term relates. For example, in the feature "on a face of the first substrate", this face of the first substrate is not necessarily oriented upwards but may correspond to a face oriented in any direction. Furthermore, the arrangement of a first element on a second element must be understood as being able to correspond to the arrangement of the first element directly against the second element, without any intermediate element between the first and second elements, or as being able to correspond to the arrangement of the first element on the second element with one or more intermediate elements disposed between the first and second elements.

BRIEF DESCRIPTION OF THE DRAWINGS

The present invention will be best understood from the reading of the description of example embodiments given purely by way of indication and in no way limitatively with reference to the accompanying drawings, on which:

FIGS. 6 to 14 show schematically steps of a method for producing the optoelectronic device according to the first embodiment;

FIG. 15 shows another example embodiment of the optoelectronic device according to the first embodiment;

Identical, similar or equivalent parts of the various figures described below bear the same numerical references so as to facilitate passing from one figure to another.

The various parts shown on the figures are not necessarily shown to a uniform scale, to make the figures more legible.

The various possibilities (variants and embodiments) must be understood as not being exclusive of each other and may be combined with each other.

DETAILED DESCRIPTION OF PARTICULAR EMBODIMENTS

Figure 1:
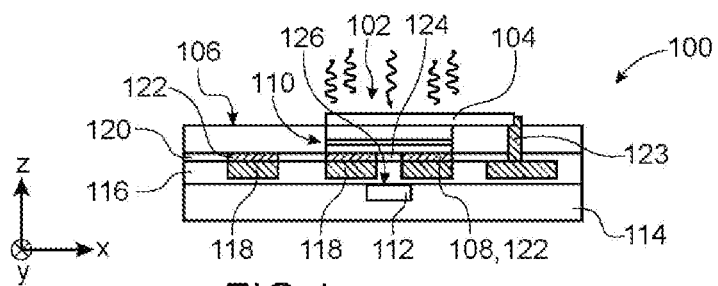
FIG. 1 shows schematically an optoelectronic device according to a first embodiment.

FIG. 1 is a view in cross section showing schematically an optoelectronic device 100 according to a first embodiment.

The device 100 includes at least one emissive component 102 corresponding for example to an LED or an OLED. The emissive component 102 is for example able to emit light in the visible and/or infrared domain. This emissive component 102 includes a first electrode 104 disposed on the same side as an emissive face 106 of the device 100, i.e. on the same side as the face of the device 100 through which the emissive component 102 is intended to emit light. The first electrode 104 is at least partially transparent to the light intended to be emitted by the emissive component 102, and also at least partially transparent to the light (visible and/or infrared domain) intended to be received from the outside of the device 100 through the emissive face 106 and captured by a photodetector component 112 of the device 100 when this photodetector component 112 is intended to capture the light coming from the outside of the device 100. The first electrode 104 may include for example a conductive transparent oxide such as ITO (indium tin oxide).

The emissive component 102 also includes a second electrode 108 and at least one emissive element 110 disposed between the first and second electrodes 104, 108. The second electrode 108 is not transparent, but reflective with respect to the light intended to be emitted by the emissive component 102 and the light received by the device 100 through the emissive face 106. For example, the second electrode 108 includes metal. The emissive element 110 corresponds to example to a stack of materials forming a p-n junction with, between the portions of p- and n-doped semiconductors, one or more semiconductor materials forming one or more quantum wells superimposed on one another. The material or materials of the emissive element 110 advantageously correspond to at least one of the following semiconductor materials: AlInGaN, InGaN, AlGaN, GaN.

The device 100 also includes at least one photodetector component 112, for example an organic or inorganic photodiode. In the example embodiment shown on FIG. 1, this photodetector component 112 forms part of an integrated circuit 114 comprising other electronic components, for example of the CMOS type, configured for controlling the emissive component 102 and the photodetector component 112. The emissive component 102 is secured to the integrated circuit 114.

The integrated circuit 114 includes one or more interconnection levels, not shown on FIG. 1, advantageously including metal portions, electrically connecting the emissive component 102 and the photodetector component 112 to the other electronic components of the integrated circuit 114.

On the example embodiment shown on FIG. 1, the integrated circuit 114, and therefore the photodetector component 112, is secured to the emissive component 102 by hybrid direct bonding. For this purpose, a first dielectric layer 116 is disposed on top of the photodetector component 112 (against the photodetector component 112 on the example of FIG. 1), and first connection pads 118 are formed in the direct dielectric layer 116. In addition, a second dielectric layer 120 is disposed under the emissive component 102 (against the emissive component 102 on the example of FIG. 1) and second connection pads 112 are formed in the second dielectric layer 120. The dielectric layers 116, 120 are at least partially transparent to the light intended to be emitted by the emissive component 102, and also at least partially transparent to the light (visible and/or infrared domain) intended to be received from the outside of the device 100 through the emissive face 106 and captured by a photodetector component 112 of the device 100 when this photodetector component 112 is intended to capture the light coming from the outside of the device 100.

Thus the first dielectric layer 116 is disposed between the photodetector component 112 and the second dielectric layer 120, the second dielectric layer 120 is disposed between the first dielectric layer 116 and the emissive component 102, and the first and second dielectric layers 116, 120 are disposed between the emissive and photodetector components 102, 112.

The first and second connection pads 118, 122 advantageously include metal. At least one of the second connection pads 122 is disposed and secured against the second electrode 108. On FIG. 1, the second electrode 108 and the second connection pad 122 formed against it are shown in the form of a single element.

The hybrid direct bonding implemented corresponds to a dielectric-dielectric direct bonding of the material of the first dielectric layer 116 against the material of the second dielectric layer 120, and a metal-metal direct bonding of the first connection pads 118 against the second connection pads 122.

To obtain a hybrid direct bonding of good quality, it is preferable, at the faces secured against each other, for the degree of occupation of the connection pads 118, 122 on each of these faces preferably to be between 60% and 90% of the conductive zone in the region of these faces forming the active zone of the device 100, i.e. the region in which the matrix of emissive 102 and photodetector 112 components is formed, and for the distribution of the connection pads 118, 122 on these connection faces (in the active zone and optionally outside this active zone) to be relatively uniform, i.e. for the connection pads 118, 112 to be located not in only a part of these faces but in the whole of these faces. Prior to the bonding step proper, the connection faces are flattened by chemical mechanical polishing (CMP). The flatness of the surface obtained during this step also determines the quality of the hybrid direct bonding implemented.

Although this is not visible on FIG. 1, at least some of the first connection pads 118 are electrically connected to the interconnection levels of the integrated circuit 114 by means of vias, thus providing electrical connections between the electrodes 104, 108 of the emissive component 102 and the control electronics formed in the integrated circuit 114. On FIG. 1, the second electrode 108 of the emissive component 102 is electrically coupled to first and second connection pads 118, 122 with which the second electrode 108 is in contact, and the first electrode 104 is electrically coupled to other first and second connection pads 118, 122 by means of a via 123.

The emissive component 102 and the photodetector component 112 are superimposed one on the other. However, the photodetector component 112 is intended to implement a capture of light entering the optoelectronic device 100 from the emissive face 106 and/or part of the light emitted by the emissive component 102. In the first embodiment described here, for this capture to be able to be implemented, the second electrode 108 (which is formed by at least one at least partially reflective material) has at least one hole 124 passing through it disposed vertically in line with at least a part 128 of a detection surface 126 of the photodetector component 112, enabling light to enter the optoelectronic device 100 from the emissive face 106 and to reach the photodetector component 112 by passing through the emissive component 102 and passing through the hole 124, and/or enabling light emitted from the emissive component 102, and more particularly from the side thereof located opposite the photodetector component 112, to be captured by the photodetector component 112 through the hole 124.

Figure 2:
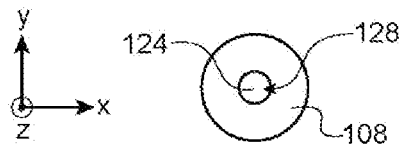
FIGS. 2 to 5 show schematically a plan view of the second electrode of an emissive component and of the photodetector component of an optoelectronic device according to various configurations.

FIG. 2 shows schematically a plan view of the second electrode 108 of the emissive component 102 and of the photodetector component 112 of an optoelectronic device 100 according to this first embodiment. In the example embodiment described here, the hole 124 includes, in a plane parallel to the detection surface 126 of the photodetector component 112, a circular cross section. Other forms of cross section of the hole 124 are however possible.

According to the application envisaged for the photodetector component 112, the dimensions of the hole 124 may vary. Thus, according to a first example, when the photodetector component 112 is used for implementing a calibration of the emissive component 102 by measuring a luminosity value of the emissive component 102, the hole 124 may have a diameter equal to approximately one tenth of the dimension of a side of the emissive component 102 (for example a diameter equal to 1 µm when the dimensions of the sides of the emissive component 102 are equal to 10 µm). In this case, the loss of luminosity of the emissive component 102 is very small because only 1% of the bottom surface of the emissive element 110 is not in contact with the second electrode 108. According to a second example, when the photodetector component 112 is used for implementing a capture of external light entering the optoelectronic device 100 from its emissive face 106, for example to implement a detection of presence in front of the optoelectronic device 100, the hole 124 may have a diameter equal to approximately four tenths of the dimension of a side of the emissive component 102 (for example a diameter equal to 4 µm when the dimensions of the sides of the emissive component 102 are equal to 10 µm). In this case, the loss of luminosity of the emissive component 102 is also very small because only 16% of the bottom surface of the emissive element 110 is not in contact with the second electrode 108.

In a second embodiment, the optoelectronic device 100 may include an emissive component 102 the second electrode 108 of which does not have a hole passing through it. In this case, so that the photodetector component 112 may implement a capture of light entering the optoelectronic device 100 from the emissive face 106 and/or a capture of part of the light emitted by the emissive component 102, a part 129 of the detection surface 126 of the photodetector component 112 is not disposed vertically in line with the second electrode 108 of the emissive component 102.

Figure 3:

FIG. 3 shows schematically a plan view of the second electrode 108 of an emissive component 102 and of the photodetector component 112 of an optoelectronic device 100 of an example of this second embodiment. On the example shown on FIG. 3, the part 129 of the detection surface 126 that is not disposed vertically in line with the second electrode 118 forms a ring located at the outer edges of the surface 126.

According to a variant of this second embodiment, it is possible for the part 129 of the detection surface 126 that is not disposed vertically in line with the second electrode 108 to form only a portion of a ring located at the outer edges of the surface 126.

In another configuration, the emissive component 102 forms part of a set of emissive components 102 disposed alongside each other and each including at least a first electrode 104 disposed on the same side as the emissive face 106, a second electrode 108, and an emissive element 110 disposed between the first and second electrodes 104, 108, and a part 129 of the detection surface 126 of the photodetector component 112 is not disposed vertically in line with the second electrode 108 of each of these emissive components 102.

Figure 4:
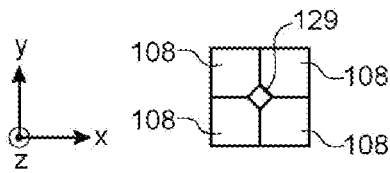

FIG. 4 shows schematically a plan view of the second electrodes 108 of such a set of emissive components 102 according to this example. On the example in FIG. 4, these emissive components 102 are disposed in the form of a 2×2 matrix, and the part 129 of the detection surface 126 that is not disposed vertically in line with the second electrodes 108 is located vertically in line with the centre of this matrix at which each of the second electrodes 108 is cropped in order to form a hole through which the part 129 of the detection surface 126 is accessible for light directed towards this detection surface 126.

Figure 5:
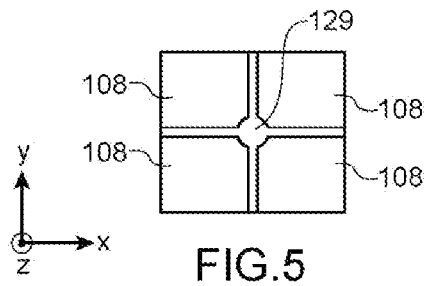

On the diagram in FIG. 4, the second electrodes 108 are shown as being adjacent, or in contact, in pairs. However, when the emissive components 102 can be controlled independently of each other, the second electrodes 108 are not in contact in pairs. FIG. 5 shows schematically such a configuration. In this case, light can reach the detection surface 126 of the photodetector component 112 if said surface is present vertically in line with the spaces separating the second electrodes 108. In a variant, it is possible to block the light passing between the second electrodes 108 by interposing metal portions of one or more interconnection levels located between the emissive components 102 and the photodetector components 112.

Advantageously, the optoelectronic device 100 includes a plurality of emissive components 102 disposed in a matrix (advantageously forming a screen) and a plurality of photodetector components 112 so that the second electrode 108 of each of the emissive components 102, or of only some of these emissive components 102, has at least one hole 124 passing through it disposed vertically in line with at least a part 128 of a detection surface 126 of one of the photodetector components 112 and/or so that a part 129 of the detection surface 126 of one of the photodetector components 112 is not disposed vertically in line with the second electrode 108 of one or more of the emissive components 102.

When the photodetector component or components 112 are configured for implementing a capture of a part of the light emitted by the emissive component or components 102 and a calibration of the emissive component or components 102, the optoelectronic device 100 may furthermore include at least one device for calculating compensation of a control signal, for example a control voltage, of the emissive component or components 102 according to the measured luminosity value of the emissive component or components 102. In the configuration shown on FIG. 1, this compensation calculation device or devices are for example formed by electronic components of the integrated circuit 114. The optoelectronic device 100 may also include one or more memories wherein the value or values representing the luminosity measured by the photodetector component or components 112 are stored. This memory or memories are for example formed by other electronic components of the integrated circuit 114.

A method for implementing the optoelectronic device 100 according to the first embodiment is described below in relation to FIGS. 6 to 14.

Figure 6:
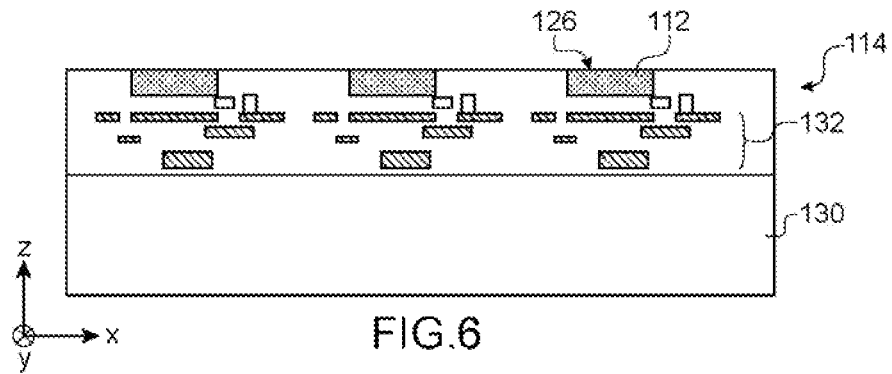

In this method, the photodetector components 112 are produced so that they form part of the integrated circuit 114. On FIG. 6, this integrated circuit 114 includes a first substrate 130 from which CMOS electronic components, not visible on FIG. 6, are produced. These components are in particular intended to form the control electronics of the optoelectronic device 100, and optionally the compensation-calculation device or devices and the memory or memories described above. A plurality of interconnection levels 132 are produced on the first substrate 130. In this embodiment, the photodetector components 112 are produced in the form of a so-called "backside" CMOS sensor, i.e. such that the detection surfaces 126 of the photodetector components 112 correspond to the rear faces of these components and wherein the interconnection levels 132 are disposed between the photodetector components 112 and the first substrate 130. In addition, in the example embodiment described here, the photodetector components 112 are arranged in a matrix.

Figure 7:
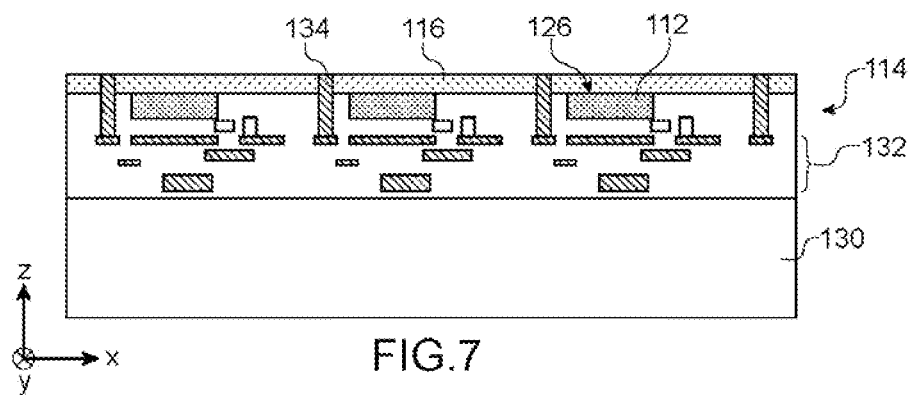
Figure 8:
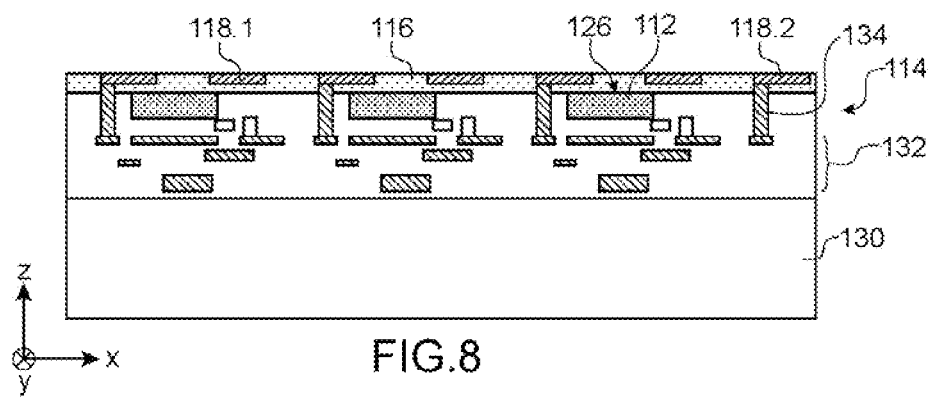

As shown on FIG. 7, the first dielectric layer 116 is deposited on the face of the integrated circuit 114 whereon the photodetector components 112 are disposed, thus covering the photodetector components 112.

Openings are next etched through the first dielectric layer 116 and a part of the thickness of the dielectric material wherein the interconnection levels 132 are located. Metal material is next deposited in these openings so as to form conductive vias 134 to which the first and second electrodes 104, 108 of the emissive components 102 are intended to be electrically connected.

The first connection pads 118 are next produced in the first dielectric layer 116, for example by etching cavities in the first dielectric layer 116 and filling in these cavities with a metal material, for example copper, by a method of the damascene type. On FIG. 8, only some of the first connection pads 118 are shown. In this example, the first connection pads bearing the references 118.1 have a form substantially similar to that of the second electrodes 108 of the emissive components 102 that will subsequently be disposed vertically in line with the photodetector components 112. Thus, on FIG. 8, the first connection pads 118.1 have an annular shape and have at their centre a hole disposed vertically in line with a part of the detection surface 126 of the photodetector components 112. In addition, these first connection pads 118.1 are electrically coupled with the vias 134 and will subsequently serve to form the electrical connections to the second electrodes 108 of the emissive components 102 that will form the anodes of the emissive components 102. At least one other first connection pad, designated by the reference 118.2, is intended to be electrically connected to the first electrodes 104 of the emissive components 102 that will be produced so as to form a cathode common to all the emissive components 102.

Figure 9:
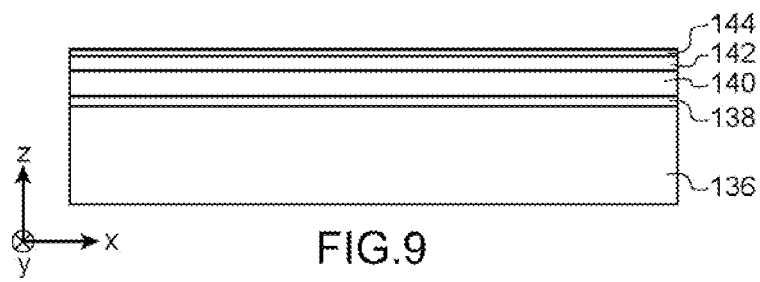

In parallel with the production of the integrated circuit 114 and of the first connection pads 118, a matrix of emissive components 102 is produced on a second substrate 136 (see FIG. 9). In the example embodiment described here, the emissive components correspond to LEDs produced by forming, on the second substrate 136 and by epitaxy, a stack of layers comprising a buffer layer 138, an n-doped semiconductor layer 140, one or more intrinsic semiconductor layers (not intentionally doped) 142 forming one or more quantum wells (with for example one or more emissive layers each disposed between two barrier layers), as well as a p-doped semiconductor layer 144. The materials of the layers 138, 140, 142 and 144 correspond for example to AlInGaN and/or InGaN and/or AlGaN and/or GaN.

Figure 10:
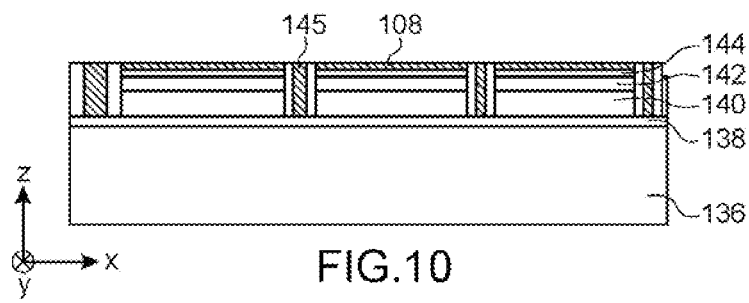

As shown on FIG. 10, trenches laterally delimiting the emissive components 102 from each other are next produced through the layers 144, 142 and 140. An electrically conductive material 145, for example metallic, is next deposited in the trenches. This conductive material 145 is intended to form a grille around the emissive components 102 and to properly drain the common cathode current of these emissive components 102. The emissive components 102 are arranged forming a matrix similar to the one formed by the photodetector components 112. The conductive material 145 is laterally surrounded by dielectric material in order to electrically insulate this conductive material 145 with respect to the layers 140, 142 and 144. The second electrodes 108 are also produced on the layer 144 and are not in contact with the conductive material 145.

Figure 11:
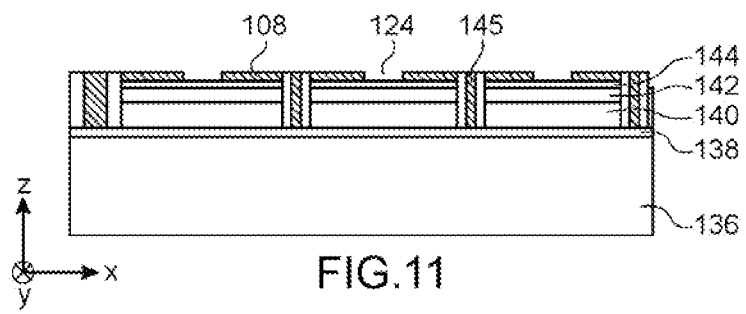
Figure 12:
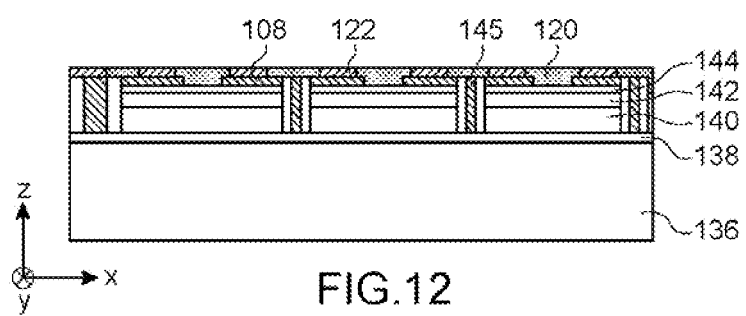

Holes 124 are next etched through the second electrodes 108 (see FIG. 11). The dimensions of the holes 124 are selected according to the application required for the photodetector components 112 (measurement of luminosity external to the device 100 and/or measurement of luminosity of the emissive components 102) and therefore of the capture surface necessary for the photodetector components 112.

The second dielectric layer 120 is next produced on the previously produced structure, covering in particular the top faces of the second electrodes 108 and of the portions of electrically conductive material 145, and filling the holes 124. The second connection pads 122 are next produced in the second dielectric layer 120, on the second electrodes 108 and on at least one of the portions of electrically conductive material 145 located at the periphery of the matrix of emissive components 102 (see FIG. 12). In the example embodiment described here, the second connection pads 122 produced on the second electrodes 108 have, in a plane parallel to the surface of the second electrodes 108 on which the second connection pads 122 are produced, a cross section with a form substantially similar to those of the second electrodes 108. Thus, in the example embodiment described here, this cross section is annular in shape, with at the centre a hole 146 with dimensions greater than or equal to that of the hole 124. FIG. 13 shows schematically a plan view of one of the second electrodes 108 through which one of the holes 124 passes and of one of the second connection pads 122 through which a hole 146 passes.

Hybrid direct bonding is next implemented between the two structures produced, with the first and second connection pads 118, 112 being put in contact, and the materials of the first and second dielectric layers 116, 120 being put in contact. Prior to this putting in contact, the surfaces intended to be put in contact undergo chemical mechanical polishing in order to obtain surface states allowing implementation of the direct bonding.

Each of the holes formed in the layer serving for producing the first connection pads 118.1 is intended to be aligned with one of the holes 124 and one of the holes 146. Because of errors in alignment that may occur, in particular during the bonding between the two structures, one of these three holes may advantageously be substantially smaller than the other two. In the example described here in relation to FIGS. 6 to 14, the holes 124 have smaller dimensions than the holes 146 and the holes formed in the layer serving to produce the first connection pads 118.1. Thus, even if errors in alignment occur, the effective dimension of the light passage formed for each photodetector component 112 is not affected by these errors in alignment and is of fixed value defined by the dimensions of the smallest of the three holes. This guarantee of the dimensions for the passage of light as far as the photodetector components 112 is highly advantageous, in particular when the photodetector components 112 are used for calibrating the emissive components.

The second substrate 136 is next removed, for example by grinding when the second substrate 136 includes silicon or by laser removal, or "laser lift-off", when the second substrate 136 includes sapphire.

The buffer layer 138 is next removed, and then the first electrodes 104 are produced for example by deposition of one or more materials, for example ITO. On FIG. 14, the first electrodes 104 correspond to a layer of ITO deposited in place of the buffer layer 138, electrically connected to the portions of electrically conductive material 145 and forming a common cathode of the emissive components 102.

The completed optoelectronic device 100 is shown on FIG. 14. Optionally, it is possible to implement other steps, such as for example the production of light wavelength conversion elements, light extraction elements, or lenses, on the emissive face 106 and advantageously to the scale of the optoelectronic device 100. These optical elements may serve for the emissive function and/or the light-capture function of the device 100.

In the method described above, the photodetector components 112 are produced in the form of a so-called "backside" CMOS sensor, i.e. the detection surfaces 126 of the photodetector components 112 correspond to the rear faces of these components 112 and wherein the interconnection levels 132 are disposed between the photodetector components 112 and the first substrate 130. In a variant, the photodetector components 112 may be produced in the form of a so-called "frontside" CMOS sensor, i.e. the detection surfaces 126 of the photodetector components 112 correspond to the front faces of these components 112 and wherein the photodetector components 112 are disposed between the interconnection levels 132 and the first substrate 130. FIG. 15 shows an example embodiment of the optoelectronic device 100 wherein the photodetector components 112 are produced in a form of a so-called "frontside" CMOS sensor.

According to an example embodiment alternative to the one shown on FIG. 1, and which may be applied to the various embodiments, the emissive components 102 and the photodetector components 112 may form modules distinct from each other, attached to a support and each comprising at least one of the emissive components 102, one of the photodetector components 112 and other electronic components forming for example the device for calculating compensation of the control voltage of the emissive device according to the measured luminosity value of the emissive component. Such modules may be produced as described in the documents EP 3 381 060 A1 and "A New Approach for Fabricating High-Performance MicroLED Displays" by F. Templier et al., SID Symposium Digest of Technical Papers, Volume 50 (1), Jun. 1, 2019. For example, the emissive components 102, the photodetector components 112 and the other electronic components may be produced on various substrates, and then cropped, assembled in the form of separate modules and finally attached to a support corresponding for example to one or more printed circuits.

As already indicated previously, the photodetector components 112 of the optoelectronic device 100 may serve to implement a calibration of the emissive components 102 of the optoelectronic device 100. Such a calibration may for example serve to configure the emissive components 102 so as to obtain an identical luminosity between all the emissive components 102. For this purpose, the photodetector components 112 may measure the luminosity of the emissive components 102 for certain control current or voltage values applied to the emissive components 102 (preferably the same on all the emissive components 102 so that the luminosities measured are comparable). The measurements obtained may be stored, and then a correction to the control currents or voltages to be applied to the emissive components 102 may be calculated and implemented according to these measurements. Alternatively, calculations may be made on the measurements made and the results of these calculations may be stored and used for determining the correction to the control currents or voltages to be applied to the emissive components 102. The memory or memories in which the measured luminosity values or the results of calculations are stored may be formed in the integrated circuit 114 or by electronic components of the distinct modules produced.

A first example of calibration of the emissive components 102 of the optoelectronic device 100 is described below. In this first example, when the emissive components 102 are switched on, i.e. when they are powered up, each emissive component 102 is controlled so as to emit light, for example by injecting a current of maximum acceptable value for the emissive components 102 in order to obtain the maximum luminosity emitted by the emissive components 102. This control may be achieved by switching on each of the emissive components 102 one after the other, or by successive groups of emissive components 102, or all the emissive components 102 at the same time. When each pixel of the screen formed by the emissive components 102 includes a plurality of emissive components 102 each intended to emit a light of a given wavelength, the emissive components 102 of each pixel are not switched on simultaneously in order to be able to calibrate separately the emissive components 102 intended to emit different wavelengths.

The luminosity of the emissive components 102 switched on is next measured and stored in memory. A local calculation of compensation is next made when it is wished to emit light corresponding to the required value.

To simplify the calculation to be made for calibrating the emissive components 102, it is possible to suppose that the luminosity varies linearly with the value of the control current or voltage applied, and that there is only one slope offset to be compensated for. The calibration implemented consists in this case in determining and applying a correction coefficient to the value of the control current or voltage sent as an input of each of the emissive components 102.

It is however possible to calibrate emissive devices 102 for which the luminosity obtained as an output does not vary linearly with the value of the control current or voltage applied as an input of the emissive components 102. In this case, a plurality of measurements may be made with various injected currents to determine a plurality of corrective coefficient values to be applied according to the value of the control current or voltage.

Such a calibration may be implemented in an analogue and/or digital manner. The electronic components implementing this calibration may be disposed in the integrated circuit 114 or in each module comprising the emissive components 102 and the photodetector components 112.

Figure 16:
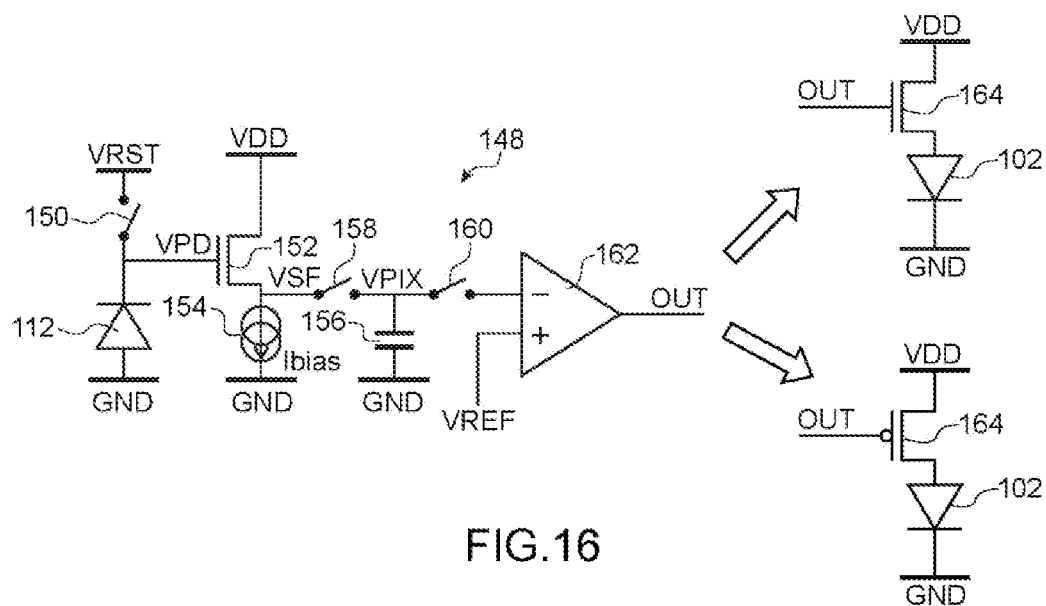
FIG. 16 shows an example embodiment of a device for calculating compensation of a control voltage of an emissive component according to the measured luminosity value of this emissive component.

FIG. 16 shows schematically an example embodiment of a device 148 for compensating a control voltage of an emissive component 102 according to the measured luminosity value of the emissive component 102, able to implement a calibration as described above.

This device 148 includes a switch 150, for example formed by a transistor, serving to apply a reinitialisation voltage VRST to the photodetector component 112 (here a photodiode). The device 148 also includes a transistor 152, here of the NMOS type, coupled to a biasing current source 154. The gate of the transistor 152 being connected to the photodetector component 112, the transistor 152 therefore has a function of "voltage follower" on the voltage VPD obtained at the terminals of the photodetector component 112. The voltage VPD is copied (to within VGS, i.e. the voltage between the gate and the source of the transistor 152) on the source of the transistor 152 (corresponding to the voltage VSF on FIG. 16). The value of the voltage VSF is stored in a capacitor 156 when the switch 158 is active. On FIG. 16, the voltage at the terminals of the capacitor 156 is called VPIX. The capacitor 156 is also coupled, by means of another switch 160, to a first input (inverting input on the example in FIG. 16) of a comparator 162. The mean value of the voltages measured by the other photodetector components 112, called VREF on FIG. 16, is applied to the second input (non-inverting input on the example in FIG. 16) of the comparator 162. Depending on whether the luminosity measured by the photodetector 112 is above or below the mean, the voltage delivered at the output of the comparator 162 will be adjusted. For example, if the voltage delivered at the output of the photodetector component 112 is below the mean, this means, in the example described here, that the emissive component 102 is brighter than the mean. The control voltage applied to the driver transistor 164 of the emissive component 102, corresponding to the output voltage of the comparator 162, will then be adjusted (lowered in the case of a driver transistor 164 of the NMOS type, or increased in the case of a driver transistor 164 of the PMOS type).

Such a device 148 is for example used when the emissive components 102 are controlled by a PWM (pulse width modulation) modulated control voltage, wherein the value of the luminosity to be displayed by each emissive component 102 is dependent on the time during which each emissive component 102 is illuminated with its maximum luminosity.

In such a device 148, the optoelectronic device 100 is indirectly controlled since the value of the output voltage of the photodetector component 112 will modify the value of the control voltage obtained at the output of the comparator 162, which will itself influence the luminance emitted by the emissive component 102 and consequently the light captured by the photodetector component 112.

The mean value of the voltages delivered at the output of the photodetector components 112 may for example be calculated only once, before proceeding with the correction phase. Alternatively, this mean value may also be calculated dynamically and refreshed regularly.

In the device 148 described above, the measurement and the calculation of the mean value of the voltages delivered at the output of the photodetector components 112 must be regularly repeated, for example every 5 to 10 images displayed by the matrix of emissive components 102, because this value is stored in capacitors.

In a variant, it is possible for each column of the matrix of emissive components to be coupled to an input of an analogue to digital converter the output of which is coupled to the input of a memory, an output of the memory being coupled to the input of a digital to analogue converter, and the output of the digital to analogue converter is coupled to the gates of the driver transistors of the emissive components 102 of the column. In this case, during the calibration phase, the value of the output voltage of the comparator 162 of each pixel of one and the same column is read, one row after the other. This value is then converted into a digital value, to be stored in the memory (or optionally used for calculations the results of which are next stored). Regularly, for example every 5-10 images, the stored values are delivered at the output of the memory and then converted into analogue values and reinjected into the pixels, for example on the capacitors Cgs of the driver transistors of the emissive components 102.

A second example of calibration of the optoelectronic device 100 is described below and shown schematically on FIG. 17. In this second example, the optoelectronic device 100 includes a device 166 for measuring luminosity external to the circuit comprising the emissive components 102 and the photodetector components 112. For example, control signals of increasing values (for example digital) are applied, via the control circuit bearing the reference 168 on FIG. 17, at the input of one or more emissive components 102 until required luminosity values are obtained measured by the external luminosity measurement device 166. When the target luminosity is achieved, the device 100 may then make a measurement of luminosity by the photodetector components 112, these measurements then being able to be stored in a non-volatile memory integrated in the circuit 166. A compensation, for example similar to that previously described in the preceding first example, may then be implemented by the compensation-calculation device 148.

Figure 17:
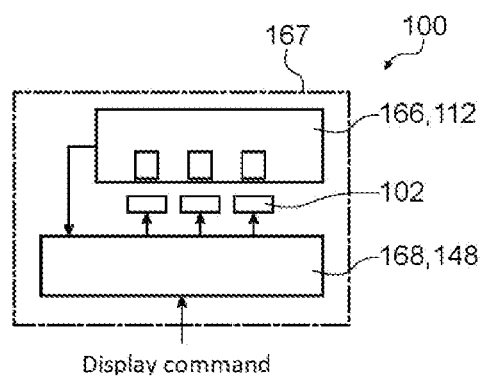
FIGS. 17 to 19 show various configurations of an electronic device according to a particular embodiment.

In the example embodiment shown on FIG. 17, the emissive components 102, the photodetector components 112 and the circuits 148, 168 and 166 may be formed in the form of independent modules 167 attached to a support, as previously described.

The first and second calibration examples previously described are advantageously implemented for a device 100 the emissive components 102 of which form pixels all physically separated in the form of modules 167 attached to a support and forming a large screen.

Figure 18:
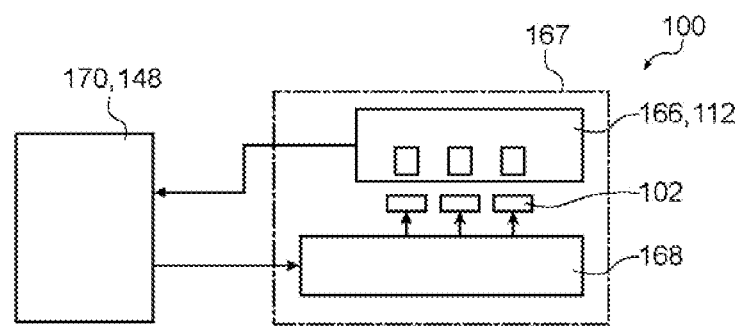

In a variant of the second example of calibration described above, the non-volatile memory in which the luminosity values measured by the external luminosity measuring device 166 are stored may be external to the circuit comprising the emissive components 102 and the photodetector components 112. In this case, this memory may be located in a video card 170 with which the external luminosity measuring device 166 and the circuit comprising the emissive components 102 and the photodetector components 112 communicate. In this configuration shown schematically on FIG. 18, the video card 170 may also include the compensation-calculation device 148.

Figure 19:
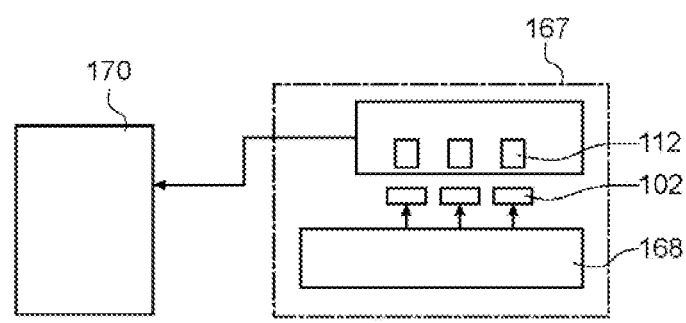

In a manner that is complementary or alternative to the various calibration examples described above, the photodetector components 112 of the optoelectronic device 100 may serve to implement an image capture and/or a detection. In this case, the luminosity information captured by the photodetector components 112 may be sent into the video card 170 with which the photodetector components 112 communicate. For example, it is possible to detect a presence via the shadow produced on the optoelectronic device 100 with an external light, such as the silhouette of a person or the shadow of a hand or of a finger (for example when the optoelectronic device 100 forms a touch screen). This detection may be done when the emissive components 102 are not emitting any light, but also when only some of the emissive components 102 are emitting light (the data coming from the photodetector components 112 that are disposed under the emissive components 102 that are switched on are ignored). Such a configuration is shown schematically on FIG. 19.

The device 100 may be used for other applications, for example as an AR (augmented reality) and/or VR (virtual reality) spectacles micro-display, for which the function of capture by the photodetector components 102 makes it possible to implement an eye-tracking function.

The invention claimed is:
1. An optoelectronic device comprising at least:
an emissive component including at least a first electrode, a second electrode, and an emissive element disposed between an emissive face of the optoelectronic device and the second electrode;

a photodetector component such that the second electrode of the emissive component is disposed between the photodetector component and the emissive element;
wherein:
the emissive component and the photodetector component are superimposed one above the other, and
the second electrode has at least one hole passing through it, disposed vertically in line with at least a part of a detection surface of the photodetector component and/or a part of the detection surface of the photodetector component is not disposed vertically in line with the second electrode and form a ring located at the external edges of the detection surface of the photodetector component.

2. The optoelectronic device according to claim 1, wherein the photodetector component forms part of an integrated circuit or of an electronic module comprising other electronic components configured to control at least the photodetector component and the emissive component and/or configured to store at least one measurement value intended to be delivered as an output of the photodetector component.

3. The optoelectronic device according to claim 1, wherein the photodetector component is configured to measure a luminosity value of the emissive component and/or to measure a luminosity value of a light received through the emissive face of the optoelectronic device.

4. The optoelectronic device according to claim 3, furthermore including at least one device for calculating compensation of a control signal of the emissive component according to at least the measured luminosity value of the emissive component.

5. The optoelectronic device according to claim 1, wherein the hole includes, in a plane parallel to the detection surface of the photodetector component, a circular cross section.

6. The optoelectronic device according to claim 1, wherein the emissive component forms part of a matrix of emissive components, and furthermore comprising a plurality of other photodetector components such that the second electrode of at least some of the emissive components has at least one hole passing through it disposed vertically in line with at least a part of a detection surface of one of the photodetector components and/or such that a part of the detection surface of one of the photodetector components is not disposed vertically in line with the second electrode of at least one of the emissive components.

7. The optoelectronic device according to claim 6, furthermore including at least:
a first dielectric layer covering at least the photodetector components and first connection pads disposed in the first dielectric layer;
a second dielectric layer covering at least the emissive components and second connection pads disposed in the second dielectric layer;
and wherein the first dielectric layer is secured to the second dielectric layer, and the first connection pads are secured to the second connection pads.

8. The optoelectronic device according to claim 7, wherein the photodetector component forms part of an integrated circuit or of an electronic module comprising other electronic components configured to control at least the photodetector component and the emissive component and/or to store at least one measurement value intended to be delivered as an output of the photodetector component, and wherein the first connection pads are electrically coupled to portions of an interconnection level of the integrated circuit by vias.

9. The optoelectronic device according to claim 6, wherein the emissive components and the photodetector components form modules distinct from each other, attached to a support and each comprising at least one of the emissive components and one of the photodetector components.

10. A method for producing an optoelectronic device, comprising at least:
producing at least one emissive component including at least a first electrode, a second electrode, and an emissive element disposed between an emissive face of the optoelectronic device and the second electrode;
producing at least one photodetector component such that the second electrode of the emissive component is disposed between the photodetector component and the emissive element, and such that the emissive component and the photodetector component are superimposed one above the other;
and wherein the second electrode has at least one hole passing through it disposed vertically in line with at least a part of a detection surface of the photodetector component and/or wherein a part of the detection surface of the photodetector component is not disposed vertically in line with the second electrode and form a ring located at the external edges of the detection surface of the photodetector component.

11. The method according to claim 10, wherein the photodetector component is implemented in an integrated circuit or an electronic module comprising other electronic components configured for controlling at least the photodetector component and the emissive component and/or storing at least one measurement value intended to be delivered as an output of the photodetector component.

12. The method according to claim 10, furthermore including:
after the production of the photodetector component, producing at least a first dielectric layer covering at least the photodetector component and producing first connection pads in the first dielectric layer;
after the production of the emissive component, producing at least one second dielectric layer covering at least the emissive component and producing second connection pads in the second dielectric layer;
securing, by direct bonding, the first dielectric layer against the second dielectric layer, and first connection pads against the second connection pads.

* * * * *